(12) United States Patent
Dasnurkar et al.

(10) Patent No.: US 10,215,800 B2
(45) Date of Patent: Feb. 26, 2019

(54) DEVICE SPECIFIC THERMAL MITIGATION

(71) Applicant: QUALCOMM Incorporated, San Diego, CA (US)

(72) Inventors: Sachin Dileep Dasnurkar, San Diego, CA (US); Krishna Reddy Dusety, San Diego, CA (US); Prasad Rajeevalochanam Bhadri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 530 days.

(21) Appl. No.: 14/696,182

(22) Filed: Apr. 24, 2015

(65) Prior Publication Data

US 2016/0313391 A1 Oct. 27, 2016

(51) Int. Cl.
| | |
|---|---|
| G05F 1/66 | (2006.01) |
| G06F 1/20 | (2006.01) |
| G06F 1/32 | (2006.01) |
| G01R 31/28 | (2006.01) |
| G05B 15/02 | (2006.01) |
| G05D 23/19 | (2006.01) |
| G06F 1/3206 | (2019.01) |

(52) U.S. Cl.
CPC ......... *G01R 31/2875* (2013.01); *G05B 15/02* (2013.01); *G05D 23/1917* (2013.01); *G05F 1/66* (2013.01); *G06F 1/206* (2013.01); *G06F 1/3206* (2013.01); *Y02D 10/16* (2018.01)

(58) Field of Classification Search
CPC .............. G01R 31/2875; G05B 15/02; G05D 23/1917; G05F 1/66; G06F 1/206; G06F 1/3206; Y02B 60/1275

USPC .......................................................... 702/182
See application file for complete search history.

(56) References Cited

U.S. PATENT DOCUMENTS

| | | | |
|---|---|---|---|
| 6,996,491 B2 | 2/2006 | Gold et al. | |
| 7,036,030 B1 | 4/2006 | Altmejd | |
| 8,306,772 B2* | 11/2012 | Cox | G01K 7/42 |
| | | | 702/132 |
| 8,788,866 B2 | 7/2014 | Anderson et al. | |

(Continued)

OTHER PUBLICATIONS

International Search Report and Written Opinion—PCT/US2016/023627—ISA/EPO—dated Jun. 28, 2016.

*Primary Examiner* — Stephanie E Bloss
(74) *Attorney, Agent, or Firm* — Loza & Loza LLP

(57) ABSTRACT

Embodiments contained in the disclosure provide a method and apparatus for device specific thermal mitigation. The thermal and power behavior of the device, is characterized. A thermal threshold is then determined for the device. The thermal data and thermal ramp factor for each device are determined and stored in a cross-reference matrix. A correlation factor is determined for temperature and frequency. These correlation factors determine a device mitigation temperature. The device mitigation temperature may be stored in a fuse table on the device, with a fuse blown on the device to permanently store the device mitigation temperature. The apparatus includes: an electronic device, a memory within the electronic device, and a set of fuses within the electronic device. The device also includes means for determining if a static or dynamic frequency is high, and means for mitigating a voltage and frequency used by the device, based on that determination.

16 Claims, 6 Drawing Sheets

(56) References Cited

U.S. PATENT DOCUMENTS

| | | | |
|---|---|---|---|
| 2005/0210905 A1 | 9/2005 | Burns et al. | |
| 2007/0005996 A1* | 1/2007 | Nalawadi | G06F 1/206 |
| | | | 713/300 |
| 2009/0064164 A1* | 3/2009 | Bose | G06F 1/206 |
| | | | 718/105 |
| 2012/0311357 A1 | 12/2012 | Andrews | |
| 2013/0132972 A1* | 5/2013 | Sur | G06F 1/206 |
| | | | 718/105 |
| 2013/0332720 A1* | 12/2013 | Gupta | G06F 9/4893 |
| | | | 713/100 |
| 2014/0006818 A1* | 1/2014 | Doshi | G06F 1/3203 |
| | | | 713/320 |
| 2014/0245032 A1* | 8/2014 | Vadakkanmaruveedu | |
| | | | G06F 1/203 |
| | | | 713/300 |
| 2014/0354333 A1* | 12/2014 | Phan | H03K 3/012 |
| | | | 327/109 |
| 2014/0358318 A1* | 12/2014 | Lin | G05D 23/1927 |
| | | | 700/300 |
| 2015/0043156 A1 | 2/2015 | Jain et al. | |
| 2015/0220097 A1* | 8/2015 | Kwong | G06F 1/206 |
| | | | 700/291 |
| 2015/0347330 A1* | 12/2015 | Vaishampayan | G06F 13/26 |
| | | | 710/60 |
| 2016/0246346 A1* | 8/2016 | Sugumar | G06F 1/3206 |

\* cited by examiner

DEVICE SPECIFIC THERMAL MITIGATION

FIELD

The present disclosure relates generally to thermal mitigation strategies for integrated circuits, and more specifically to device specific thermal mitigation to avoid over current, high power, and uncontrolled thermal behavior while optimizing performance.

BACKGROUND

Integrated circuits (ICs) are used in most electronic devices, including desk top computers, laptops, tablets, mobile phones, smart phones, and other personal devices. The range of applications for these devices continues to grow, and with ever more applications available, usage grows also. Integrated circuits have become an integral part of the devices incorporating them. Integrated circuits have also become significantly more complex with multiple cores providing a wide variety of processing tools. A typical example is the system-on-chip (SoC) found in many smart phones. Many electronic devices use multiple complex integrated circuits or processors to perform the tasks directed by the wide variety of applications.

Increased usage of processors, often results in heat generated by the operation of the circuits within the chip. This heat may increase and may result in unsatisfactory device performance, loss of data, or failure. Failure within the device may be limited to one specific core that was heavily utilized, or may be more widespread with multiple cores affected.

Even when failure does not occur, performance may be degraded. In smart phones the SoC may have a problem tolerating temperatures that are near the high temperature limit. Near the limit SoC performance may suffer as the frequency may bounce between a high and a low frequency. Each integrated circuit is unique and varies in how severely it is affected by high temperatures and also in how quickly it cools down. Testing may be used to determine the high temperature behavior of ICs and may be used to set performance limits.

Testing ICs is frequently performed in large lots, as many devices may need to be delivered to electronic device manufacturers to continue production. In such cases, testing determines the IC device specifications for the entire lot. While each IC may be unique, it is not feasible to individually determine and specify operating characteristics, as the lot size may be too large. In practice, this means that the behavior of the worst tested device in the lot determines the thermal benchmarks for the entire device population.

Using the worst performing device as a benchmark may save time, but may result in undervaluing the performance of the ICs, and result in performance that is not optimum. There is a need in the art to provide device specific thermal mitigation to avoid over-current, high power, or uncontrolled thermal behavior.

SUMMARY

Embodiments contained in the disclosure provide a method for device specific thermal mitigation. The thermal behavior of the device, such as a SoC, is characterized, as is the power behavior. A thermal threshold is then determined for the device, based on the thermal and power behavior. The thermal data as well as a thermal ramp factor for each device is stored in a cross-reference matrix. A correlation factor is determined for temperature and also for frequency. These correlation factors are used in determining a device mitigation temperature for the specific device. The device mitigation temperature may be stored in a fuse table or EEPROM on the device, with a fuse blown on the device to permanently store the device mitigation temperature. The individual devices may then be operated in accordance with the device mitigation temperature by software control.

A further embodiment provides an apparatus for device specific thermal mitigation. The apparatus comprises an electronic device, a memory within the electronic device, and a set of fuses within the electronic device. At least one of the fuses may be fused to permanently store a device mitigation temperature.

A still further embodiment provides an apparatus for device specific thermal mitigation. The apparatus includes means for characterizing thermal behavior of a device; means for characterizing power behavior of the device; and means for determining a thermal threshold tolerance for the device. The device also includes means for determining if static or dynamic power is high, and means for mitigating a voltage and frequency used by the device, based on that determination.

DETAILED DESCRIPTION

Figure 1:
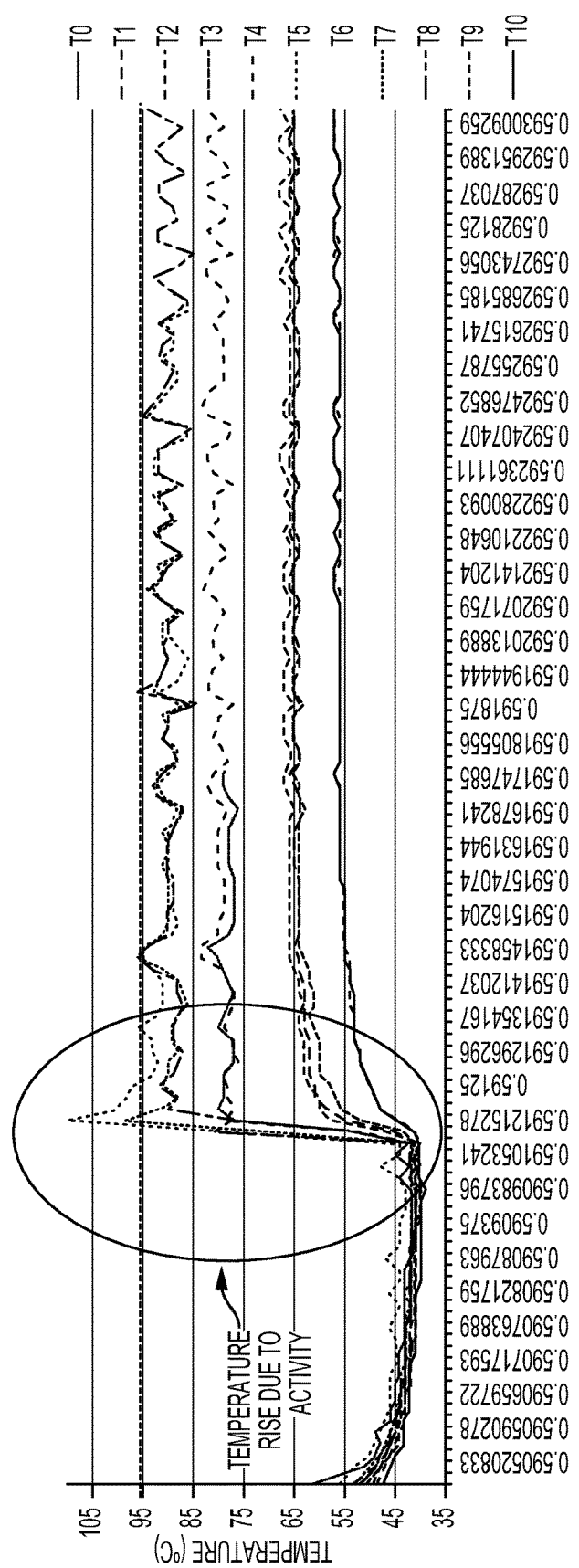
FIG. 1 illustrates a fast thermal gradient for multiple active cores in accordance with embodiments described herein.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuing description, the accompanying drawings and the appended claims.

ICs and SoCs are evaluated while undergoing thermal testing, which may also be known as thermal benchmarking. Thermal benchmarking establishes the behavior of the devices and determines the device's operating parameters. Tests such as the multi-core Dhrystone test may be used for thermal benchmarking. These values are used to determine temperature limits and design constraints when the devices are incorporated into end products such as smart phones, tablets, and other electronic devices.

In operation, when an electronic device is used, heat is generated. This heat is generated in the active cores within the ICs or SoCs of the electronic device. Heat generated by the active cores raises the temperature of the chip die that contains the core. As the die temperature increases the temperature ramp is expected to be proportional to the power dissipated by the cores.

Existing mitigation algorithms and temperatures are universal. The performance of the worst device in the group determines the performance limits for the group of devices. As a result, performance may be sacrificed to achieve thermal stability. The worst-case devices may have faster thermal ramps than the global population of devices. For these worst-case devices, tighter mitigation temperatures are required to ensure stability. While such requirements enable usage of the lowest performing devices, the rest of the device population is punished and may then be underperforming. Embodiments described herein provide mitigation only for the devices requiring it and avoid punishing the device population as a whole.

Thermal control may be performed using either a frequency or voltage pair. Parts with higher dynamic power are more affected by frequency drop, while devices with higher static power are more affected by voltage drop. Either frequency or voltage may be aggressively managed by part using embodiments described herein.

FIG. 1 illustrates the behavior of temperature sensors on a SoC device when a system level test is performed. As FIG. 1 shows, there is a sudden temperature rise due to core activity. This sudden increase may result in significant overshoot of the die temperature limits. This sudden and significant die temperature overshoot, if excess, is known as a Fast Thermal Gradient (FTG), which may cause potential system or device failures or crashes.

System level testing may use software to test the die tolerance for increasing temperature. A die that has a low heat tolerance may slow in frequency and may bounce or oscillate between lower and higher frequencies. During testing the temperature may be fixed between 80 and 90 degrees, while device behavior is observed. Each IC is unique and each will run for a different period of time at high temperature, and each will cool down at a different rate. In addition, some devices may have high static power and do not cool down. For most system level testing the worst performing device determines the thermal benchmark. The thermal benchmark must be strict enough that the worst-case device may function. Device performance overall would be improved if testing methodologies could identify the worst performing devices and manage their individual temperature profiles.

Embodiments described herein provide optimized voltage tables of devices such as application and graphics processors, modems, and SoCs that maximize performance and minimize power. More specifically, embodiments described herein provide for per part thermal mitigation set points that are programmed into the individual devices. These set points are set in a fuse table which is read to determine the mitigation temperature for the device. As a result, overcurrent and over-temperature events that degrade the performance of the smart phone, tablet, or PC are avoided. In addition, the per-part customized mitigation schedule maximized performance while minimizing risk. Above-average devices are not penalized by the behavior of limited samples needing progressive mitigation.

Figure 2:
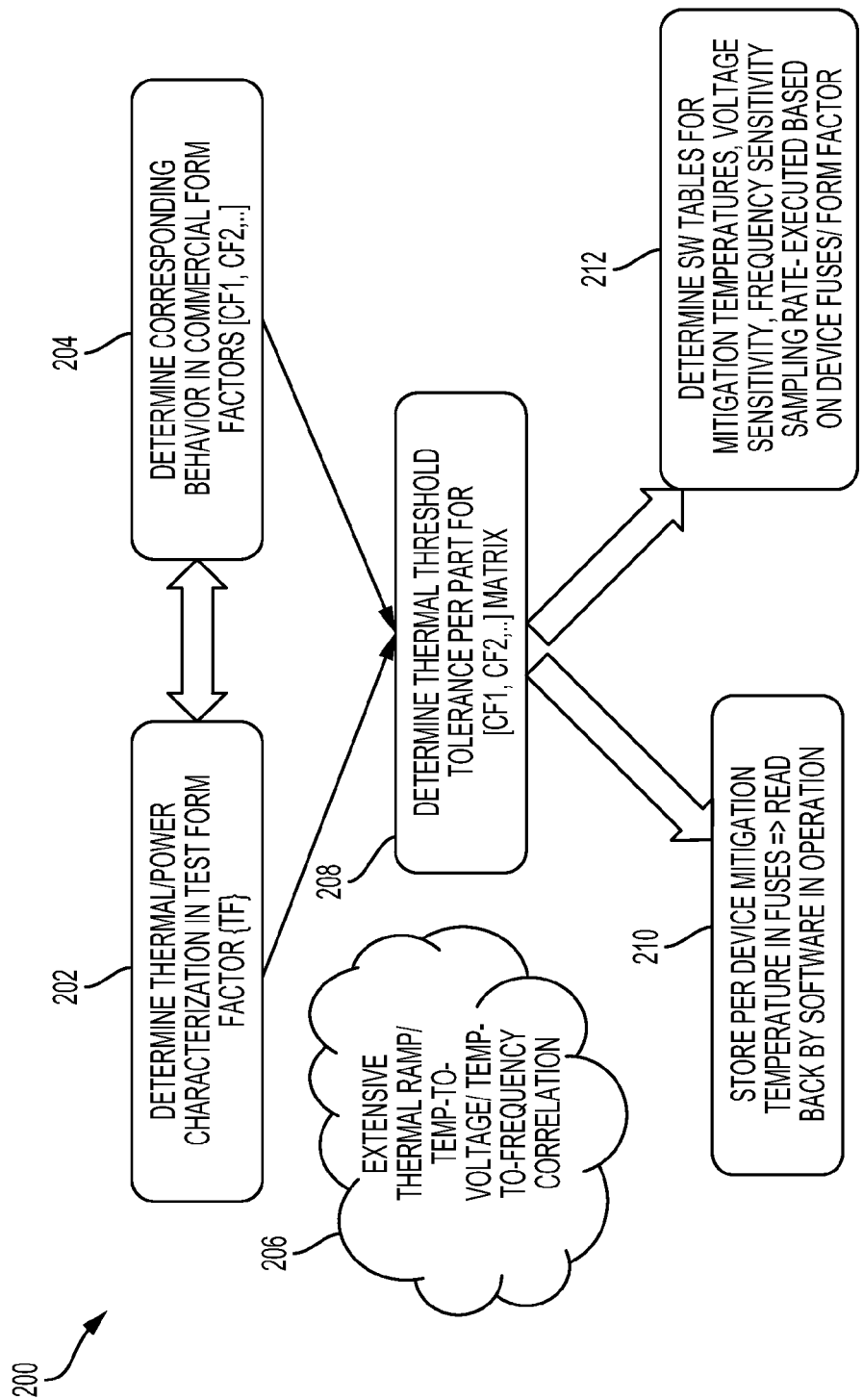
FIG. 2 provides an overview of a method of mitigating temperature, voltage sensitivity, and frequency sensitivity, in accordance with embodiments described herein.

FIG. 2 provides an overview of a method of mitigating temperature, voltage sensitivity, and frequency sensitivity. The method 200, provides that thermal and power characterization is performed for each device in step 202. This characterization is provided in a test form factor. The corresponding behavior in commercial form is determined concurrently in step 204. These values are used to determine the thermal threshold tolerance for each part or device tested. These values are then placed in a matrix in step 208. Extensive thermal ramp information and correlations between temperature and voltage and temperature to frequency are stored separately from the process, possibly in a cloud or in an EEPROM or fuse in the device, or in the device software in step 206. In step 210, the per device mitigation temperature recommendation is stored in fuses in each device. This value may be read back by software when the method is performed. In step 212 tables for mitigation temperatures, voltage sensitivity, frequency sensitivity, and sampling rate are determined. These tables are executed based on the fuses internal to the device and the device form factor.

Figure 3:
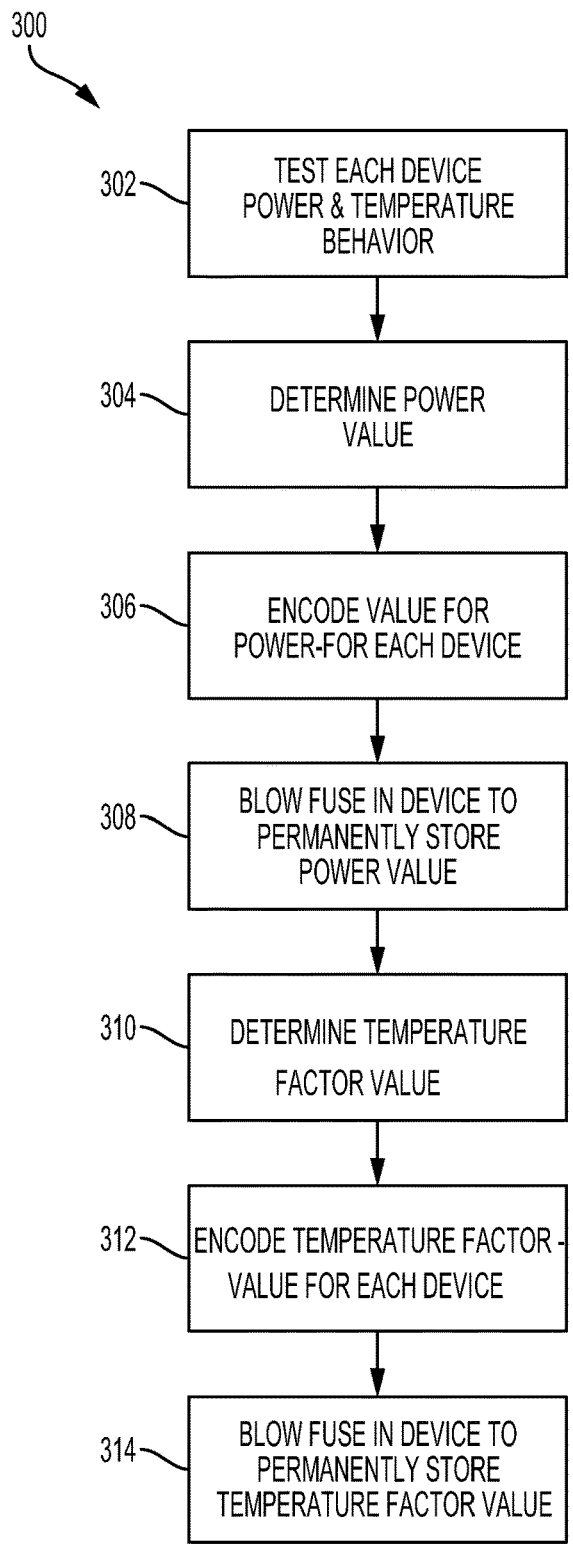
FIG. 3 is a flowchart of a method of encoding power and temperature behavior in each device, in accordance with embodiments described herein.

FIG. 3 illustrates a method for encoding power and temperature behavior within each device. The method 300, begins with step 302 when each device is tested for power and temperature behavior. As part of that determination, in step 304, the power value is determined. In step 306 this value is encoded within the device. This step is performed for each device in the lot. In step 308 a fuse is blown in the device to permanently store the power value. Next, in step 310 the temperature value is determined for each device. This value is encoded in each device in step 312. In step 314 a fuse is blown in each device to permanently store the temperature value.

The values for power and temperature behavior are encoded by blowing the fuses in each device. The encoded values are specific to that device. The individual mitigation temperatures may be stored and used to customize the thermal ramp rate for each device. The stored table defines individual mitigation temperatures so that over-current and other power issues are avoided.

Figure 4:
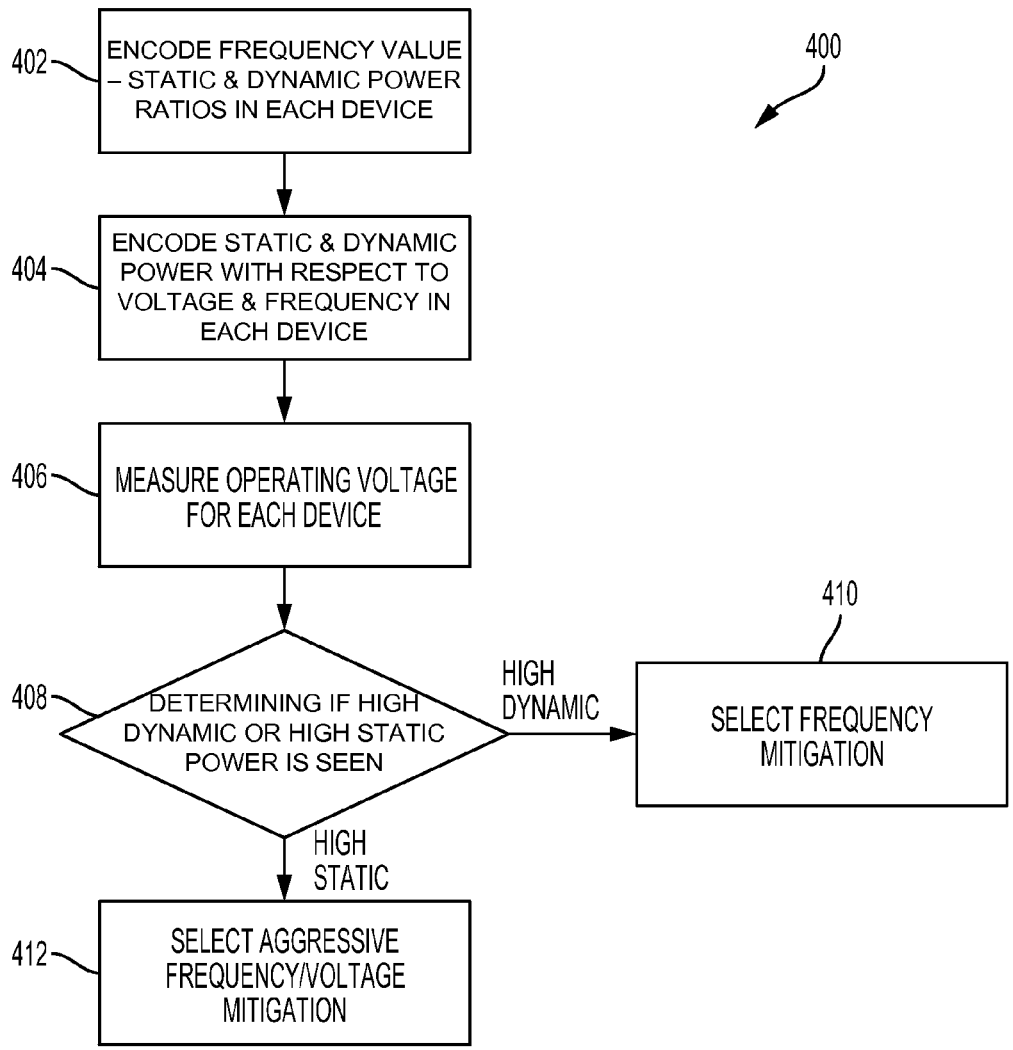
FIG. 4 is a flowchart of a method of encoding frequency and temperature behavior in each device, in accordance with embodiments described herein.

FIG. 4 is a flowchart of a method for encoding frequency and temperature behavior within each device. The method 400 begins with step 402 where a static and a dynamic frequency power ratios are encoded within each device. In step 404 a static and dynamic power with respect to voltage and frequency is encoded in each device. The operating voltage is measured in step 406. This measuring may be performed by a processor utilizing a software table. In decision block 408 it is determined if the power measured at the operating voltage, frequency, and temperature, has a high dynamic value or a high static value. If the value is a high dynamic value, then in step 410 frequency mitigation is selected for the device in question. If the operating power measured has a high static value, then aggressive frequency/voltage mitigation is required 412. This aggressive mitigation is limited to the device displaying the high static value, and that value does not characterize the entire lot of devices.

Figure 5:
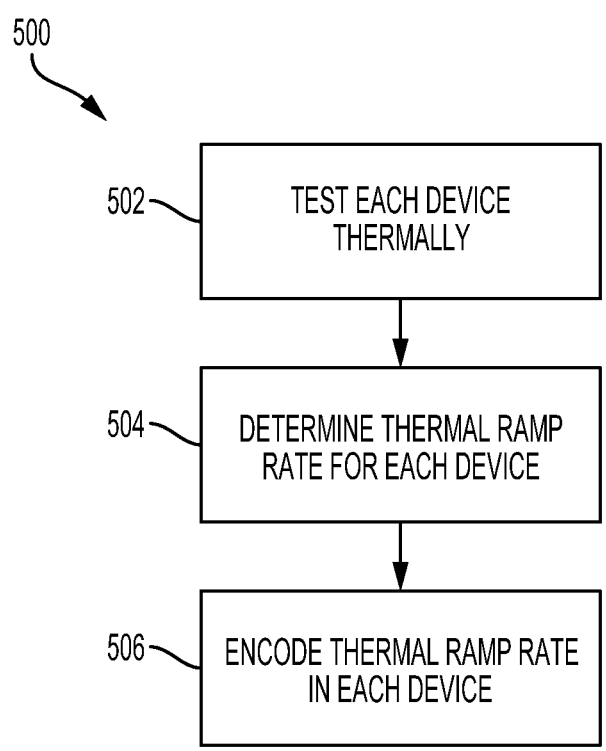
FIG. 5 is a flowchart of a method of encoding thermal ramp information in each device, in accordance with embodiments described herein.

FIG. 5 is a flowchart for encoding a thermal ramp for each device within that device. The thermal ramp is encoded in each device, using blown fuses as described above. The method 500 begins with step 502 where each device is thermally tested. Next, in step 504 the thermal ramp rate is determined for each device. In step 506 the thermal ramp rate is encoded in each device using blown fuses. A look-up table may be used to determine a progressive temperature for each device to initiate mitigation measures to avoid over-temperature problems.

Figure 6:
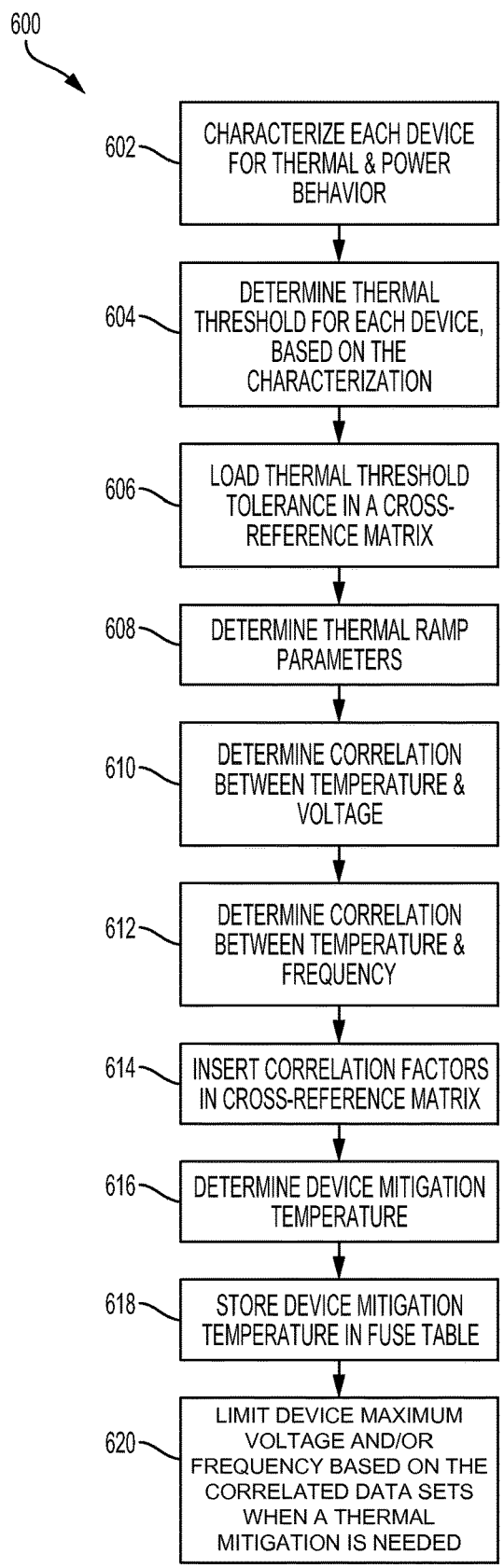
FIG. 6 is a flowchart of a method of device specific thermal mitigation, in accordance with embodiments described herein.

FIG. 6 is a flowchart of a method of providing device specific thermal mitigation to avoid over-current, high-power, and uncontrolled thermal behavior. The method 600 begins when each device is characterized for thermal and power behavior in step 602. Next, in step 604 the thermal threshold for each device is determined, based on the characterization determined above. The thermal threshold information is then loaded or stored in a thermal threshold tolerance cross-reference matrix in step 606. In step 608 the thermal ramp parameters for each device are determined based on the information above. A correlation between temperature and voltage is then determined in step 610. Similarly, in step 612 a correlation between temperature and frequency is determined. These correlation factors are also stored in a cross-reference matrix in step 614. Based on the correlated information, a device mitigation temperature is determined in step 616. This device mitigation temperature may then be stored in a fuse on the device and in a fuse table in step 618. The ASIC SoC control logic then uses the correlated data set in the matrices to limit maximum voltage for those SoC devices to sensitive voltage/temperature conditions, limit maximum frequency for those SoC devices sensitive to frequency/temperature conditions, when thermal mitigation is needed. Additionally, in some cases the correlated data set is used to determine switching frequencies on some SoC devices based on frequency/temperature curves to keep the devices below maximum temperature in step 620.

The fuse information may be stored as an automatic test equipment (ATE) fused table. This table contains the fuse information for each device tested using the ATE. An additional embodiment provides for changing the sampling rate, which allows for polling at a higher rate for risky devices. Each line of the fuse matrix may have a different form factor. A look-up or scaling table may be provided, and may accessible using software. The software may contain detailed device threshold tables for temperature, voltage, and frequency, which may be programmed into the software. When executed, the threshold tables based on the fuse read-back information and form factor, allow per-device customization. Performance may be optimized using an algorithm that provides per-part performance optimization.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of device specific thermal mitigation, comprising:
   characterizing thermal behavior of a device;
   characterizing power behavior of the device;
   determining a thermal threshold tolerance for the device;
   determining a thermal ramp rate for the device;
   storing the thermal ramp rate permanently on the device;
   determining a correlation factor for the device based on temperature and frequency;
   storing a temperature and voltage correlation factor in a cross-reference matrix;
   storing the temperature and frequency correlation factor in the cross-reference matrix;
   determining a device mitigation temperature based on the temperature and voltage correlation factor, the temperature and frequency correlation factor, and the thermal ramp rate;
   storing the device mitigation temperature in a fuse table on the device; and
   blowing a fuse on the device to permanently store the device mitigation temperature.

2. The method of claim 1, further comprising:
   storing the thermal threshold tolerance in a cross-reference matrix.

3. The method of claim 1, further comprising:
   operating the device based on the device mitigation temperature.

4. The method of claim 1, wherein a dynamic frequency power ratio as a function of voltage and frequency is encoded within the device.

5. The method of claim 1, wherein a device mitigation power factor is also permanently stored in the device.

6. The method of claim 1, wherein a static power ratio value as a function of voltage and frequency is encoded within the device.

7. The method of claim 1, further comprising:
   determining if the dynamic frequency power ratio is above a predetermined value; and
   mitigating a frequency used by the device if the dynamic frequency power ratio is above the predetermined value.

8. The method of claim 6, further comprising:
   determining if the static power ratio value is above a predetermined value; and
   mitigating a frequency and a voltage used by the device if the static power ratio value is above the predetermined value.

9. A non-transitory computer-readable storage medium storing computer-executable instructions to:
   characterize thermal behavior of a device;
   characterize power behavior of the device;
   determine a thermal threshold tolerance for the device;
   determine a thermal ramp rate for the device;
   store the thermal ramp rate permanently on the device;
   determine a correlation factor for the device based on temperature and frequency;
   store a temperature and voltage correlation factor in a cross-reference matrix;
   store the temperature and frequency correlation factor in the cross-reference matrix;
   determine a device mitigation temperature based on the temperature and voltage correlation factor, the temperature and frequency correlation factor, and the thermal ramp rate;
   store the device mitigation temperature in a fuse table on the device; and
   blow a fuse on the device to permanently store the device mitigation temperature.

10. The non-transitory computer-readable storage medium of claim 9, further comprising computer-executable instructions to:
    store the thermal threshold tolerance in a cross-reference matrix.

11. The non-transitory computer-readable storage medium of claim 9, further comprising computer-executable instructions to:
    operate the device based on the device mitigation temperature.

12. The non-transitory computer-readable storage medium of claim 9, wherein a dynamic frequency power ratio as a function of voltage and frequency is encoded within the device.

13. The computer-readable storage medium of claim 9, wherein a device mitigation power factor is also perm non-transitory anently stored in the device.

14. The non-transitory computer-readable storage medium of claim 9, wherein a static power ratio value as a function of voltage and frequency is encoded within the device.

15. The non-transitory computer-readable storage medium of claim 14, further comprising computer-executable instructions to:
   determine if the static power ratio value is above a predetermined value; and
   mitigate a frequency and a voltage used by the device if the static power ratio value is above the predetermined value.

16. The non-transitory computer-readable storage medium of claim 9, further comprising computer-executable instructions to:
   determine if the dynamic frequency power ratio is above a predetermined value; and
   mitigate a frequency used by the device if the dynamic frequency power ratio is above the predetermined value.

* * * * *